United States Patent
Friesen et al.

(10) Patent No.: US 7,286,809 B2
(45) Date of Patent: Oct. 23, 2007

(54) METHOD AND CIRCUIT SYSTEM FOR SUPPRESSING NOISE IN A SIGNAL PROCESSING CIRCUIT

(75) Inventors: Leo Friesen, Neckarsulm (DE); Reimund Rebel, Ringwood, NJ (US); Martin Siegle, Heilbronn (DE)

(73) Assignee: Atmel Germany GmbH, Heilbronn (DE)

( * ) Notice: Subject to any disclaimer, the term of this patent is extended or adjusted under 35 U.S.C. 154(b) by 432 days.

(21) Appl. No.: 10/938,073

(22) Filed: Sep. 10, 2004

(65) Prior Publication Data

US 2005/0107058 A1 May 19, 2005

(51) Int. Cl.
*H04B 1/10* (2006.01)

(52) U.S. Cl. .................. 455/296; 455/222; 455/570

(58) Field of Classification Search ........... 455/501, 455/67.13, 570, 114.2
See application file for complete search history.

(56) References Cited

U.S. PATENT DOCUMENTS

| | | | |
|---|---|---|---|
| 4,228,545 A | 10/1980 | Murakami | |
| 4,289,981 A | 9/1981 | Sakamoto et al. | |
| 4,326,297 A | 4/1982 | Sato et al. | |
| 4,528,678 A | 7/1985 | Udren | |
| 4,856,084 A | 8/1989 | Richards, Jr. | |
| 6,163,685 A * | 12/2000 | Dilling et al. | ........... 455/247.1 |
| 2002/0159538 A1* | 10/2002 | Koslar et al. | ............... 375/271 |

FOREIGN PATENT DOCUMENTS

| | | |
|---|---|---|
| DE | 26 42 755 | 3/1978 |
| DE | 2648901 | 5/1978 |
| DE | 2916127 | 11/1979 |
| DE | 2912689 | 1/1980 |
| DE | 3016118 | 11/1980 |
| DE | 3904505 | 8/1989 |
| EP | 1 271 771 | 1/2003 |

* cited by examiner

*Primary Examiner*—Temica Beamer
(74) *Attorney, Agent, or Firm*—W. F. Fasse; W. G. Fasse

(57) ABSTRACT

Noise impulses are suppressed in a signal processing circuit by gating an input signal. The gated signal is then smoothed upstream of demodulating the smoothed signal as viewed in a signal flow direction from a signal input to a processed signal output. The signal processing circuit system includes at least a signal gating section followed by a signal smoothing section followed by a demodulating section in that order and as viewed in the signal flow direction. Thus, smoothing takes place prior to demodulation.

24 Claims, 3 Drawing Sheets ured signals has, for example, a bandwidth
METHOD AND CIRCUIT SYSTEM FOR SUPPRESSING NOISE IN A SIGNAL PROCESSING CIRCUIT

PRIORITY CLAIM

This application is based on and claims the priority under 35 U.S.C. §119 of German Patent Application 103 43 332.5, filed on Sep. 12, 2003, the entire disclosure of which is incorporated herein by reference.

FIELD OF THE INVENTION

The invention relates to noise suppression, particularly in circuits for processing amplitude modulated signals.

BACKGROUND INFORMATION

Conventionally, such signal processing circuits or systems operate with the following sequence of steps: gating noise impulses out of the amplitude modulated input signal; demodulating the amplitude modulated signals; and then smoothing the demodulated signal after demodulation.

German Patent Publication DE 39 04 505 C2 describes such a system, wherein the smoothing operation takes place downstream of the demodulator stage. The terms "upstream" and "downstream" as used herein have reference to the signal flow or advance through the system from a system input to a system output.

In the German Patent Publication DE 39 04 505 C2 the noise is detected on the wideband high frequency side of the system because on this side the noise impulse has a high amplitude. The known system attempts to gate the noise impulse out of the input signal following the formation of an intermediate frequency upstream of the demodulator stage. The bandwidth of the input signal in the intermediate frequency is still rather large which entails a gating time in the range of a few microseconds. In this context the term "gating a signal" refers to either a short duration interruption of the input signal or a switching off of the input signal. In a physical sense, such signal gating means that under certain circumstances large and in any case undefined noise impulses are replaced by a small defined noise signal. That small defined noise signal is the gating gap. This gated noise passes through a selecting filter normally provided in such circuits. Such a selecting filter in systems for processing amplitude modulated signals has, for example, a bandwidth of about 3.4 kHz.

In such systems the duration of the noise that is the gap width downstream of the demodulator, has increased to several hundred microseconds. Downstream of the demodulator the signal is again gated, for example by a sample-and-hold circuit which produces a gap having normally a duration of about 500 ms. Attempts are then made to again fill up these gaps by more or less complicated interpolation methods. Such gap filling attempts rarely succeed without being heard in the audio signal. As mentioned, in the German Patent Publication DE 39 04 505 C2 a sample-and-hold circuit is arranged in the signal path downstream of the demodulator. The sample-and-hold circuit is supposed to keep the voltage in the signal path constant during the gating in order to achieve a smoothing of the interrupted portion of an audio signal. The just mentioned German Patent Publication describes gating times that are shorter than 250 microseconds.

Generally, signal processing systems that process amplitude modulated signals, encounter the problem that the noise impulses arising at the antenna are superimposed or heterodyned onto the useful signal. As a result, the signal energy at the antenna is increased. A typical example of noise impulses are the pulses generated by the ignition of a combustion engine. These impulses constitute noise that is superimposed on amplitude modulated radio signals. Such noise impulses occur regularly as the fuel in the cylinders of the engine is sequentially ignited, whereby the repetition frequency of these signals is within the range of about 60 Hz to about 600 Hz. The human ear is rather sensitive in this frequency range. As the noise impulse proceeds through the filter stages of the radio receiver, the spectrum and thus also the energy of the noise is reduced. However, the duration of a filter response is coupled to the bandwidth of the filter in accordance with the time bandwidth relationship or law. As a result, an initially large amplitude of the noise impulse can be diminished by filtering only by impairing the impulse width or impulse duration. Thus, the impulse width increases as the amplitude decreases. This phenomenon makes it more difficult to detect the noise impulse and to remove it from the useful signal.

OBJECTS OF THE INVENTION

In view of the foregoing it is the aim of the invention to achieve the following objects singly or in combination:
  to provide a method and signal processing circuit system for the suppression of noise which improves the quality of the noise suppression, particularly in amplitude modulated signal processing systems;
  to avoid increasing the impulse duration or impulse width of noise impulses; and
  to provide a more effective signal smoothing of the useful signal than was possible heretofore.

The invention further aims to avoid or overcome the disadvantages of the prior art, and to achieve additional advantages, as apparent from the present specification. The attainment of these objects is, however, not a required limitation of the present invention.

SUMMARY OF THE INVENTION

The method according to the invention comprises the following steps:
  a) receiving an amplitude modulated input signal including noise impulses,
  b) gating said input signal for separating said noise impulse signals from said input signal to produce a gated signal;
  c) smoothing said gated signal to produce a smoothed signal; and
  d) demodulating said smoothed signal following said smoothing step.

A signal processing system for suppressing noise in a useful signal such as an amplitude modulated signal comprises an input and an output including a signal gating circuit connected to said input, a signal smoothing circuit connected to said gating circuit, and a signal demodulating circuit arranged downstream of said smoothing circuit as viewed in a signal flow direction from the input to the output so that signal smoothing takes place prior to signal demodulating.

Thus, according to the invention it is important that the smoothing step is performed prior to the demodulation step and in a smoothing circuit arranged upstream of the demodulating circuit.

By smoothing the useful signal or rather the gated signal prior to demodulation it is assured that the impulse width of the primary noise received with the useful signal and/or the impulse width of a secondary noise that can occur upstream of the demodulator due to the gating operation is not widened when the signal passes through a selection filter upstream of the demodulation and through the demodulation. Thus, the invention reduces the noise amplitude and the pulse width or pulse duration of the noise impulse of any noise still in the useful signal downstream of the demodulator. Particularly, the reduction of the pulse width duration of the noise entails a desirable reduction in the audibility of the noise.

A preferred embodiment of the present invention comprises the following further steps: feeding an amplitude modulated signal into a high frequency circuit section or feeding the amplitude modulated signal into a combination of a high frequency section with a mixer to produce an intermediate frequency of the amplitude modulated signal, whereby the gating can take place either upstream or downstream of the mixing stage or frequency shifting. As a result, the gating in circuit systems with high frequency sections and the gating in systems with high frequency sections as well as intermediate frequency sections takes place where the noise impulses still have a large amplitude, but are not yet widened in their impulse duration. Thus, it is possible to reliably detect the noise impulses and keep the gating durations small. Preferably, the smoothing step involves the insertion of a replacement signal into the gating gaps of the amplitude modulated signal remaining downstream of the gating. This step makes sure that an undefined large noise impulse is reduced by a defined small noise that is produced by the interruption or gating of the noise impulse. This replacement of the large noise impulse by a small defined noise impulse results in the desired smoothing of the signals upstream of its further processing in the demodulator, that is prior to the demodulation step.

Preferably, the replacement signal is produced in such a way that the following three conditions are satisfied. The first condition requires that the replacement signal has the same amplitude as the amplitude modulated useful signal directly prior to the occurrence of the noise impulse. The second condition calls for the replacement signal to have a frequency that corresponds to the frequency of the amplitude modulated signal following a frequency shift such as the formation of an intermediate frequency. The third condition calls for the replacement signal to have at the edges of a gating gap the same phase position as the amplitude modulated remaining signal following the gating operation. Satisfying these conditions by the features of the invention assures a substantially perfect smoothing of the signal remaining downstream of the gating by a substantial conforming of the replacement signal to the amplitude modulated remaining signal following the gating. The term "substantial" in this context means that normal noise is no longer audible.

In a preferred embodiment of the invention the gating step is performed after shifting the frequency of the useful signal to a frequency bandwidth such that a noise impulse has an impulse width or duration within the range of 5 to 25 microseconds, particularly 10 to 20 microseconds.

It has been found that frequency bandwidths which are defined by the above requirements or conditions constitute a good compromise between the mutually exclusive goals of a signal processing time as short as possible on the one hand and a good or effective suppression of a neighboring channel or bandwidth on the other hand.

In the present circuit arrangement the smoothing circuit section comprises elements which produce the above mentioned replacement signal which meets the above described three conditions to achieve a substantially perfect smoothing of the useful signal remaining after the gating due to the substantial conforming of the replacement signal to the remaining useful signal.

The present circuit system preferably includes a high frequency stage connected to the system input or a high frequency stage followed by an intermediate frequency section arranged in the signal flow direction upstream of the gating circuit section. As a result, the gating takes place where the noise impulses still have a large amplitude, but have not yet increased their pulse width. Thus, the noise impulses can be detected reliably and the gating time durations can be kept small. In a preferred embodiment the gating circuit comprises an oscillating circuit having a bandwidth that is smaller than the frequency channel bandwidth of the signal sequence.

The above features or dimensions of a signal processing system according to the invention also constitute a good compromise between the goal of a minimum gating time in combination with a neighbor channel suppression as good as possible. Incidentally, the oscillator which is triggered or energized by the useful signal when the signal characteristic is undisturbed, makes it possible to well adapt the signal in the gating circuit section to the signal characteristic upstream and downstream of the gating circuit section.

In a further embodiment of the present circuit arrangement a decoupler is provided which is controlled by a noise impulse detector for decoupling an input of the oscillating circuit from the signal processing system when a noise impulse occurs. Due to the fact that the input of the oscillating circuit is decoupled from the signal processing system prior to the occurrence of the noise impulse, the oscillator oscillates with a post pulse oscillation having an oscillation characteristic that is determined by the useful signal prior to the decoupling. As a result, the oscillator provides a replacement signal that conforms very well to the preceding useful signal for the following demodulation. Another feature of the present circuit arrangement is an electronic circuit that may be either analog or digital which applies a dedamping to the oscillating circuit when the latter is decoupled from the signal processing circuit system. This feature enables the oscillating circuit to be damped during an undisturbed operation so that the useful signal is not influenced at all or is influenced only to a negligible extent. At the same time the switchable dedamping of the oscillating circuit prevents an excessive damping of the oscillating circuit following the decoupling of the input of the oscillating circuit from the signal path. An excessive damping would adversely influence the replacement signal. As a result a good smoothing of the signal is achieved that, following the gating, is fed to the following stages. Preferably the oscillating circuit comprises a parallel circuit of at least one inductance and a capacitor. Thus, the required characteristics are achieved by a parallel oscillating circuit especially well and without any substantial effort and expense for the oscillating circuit. Preferably, the electronic circuit which dedamps the oscillating circuit when it is decoupled from the signal processing system is so dimensioned that the dedamping compensates the losses occurring at the oscillating circuit. Such a dimensioning or layout of the decoupling of the oscillating circuit has the advantage that when the oscillating circuit is decoupled from its input trigger, losses are compensated simultaneously while the circuit satisfies with its resonance frequency the above mentioned first condition while it simultaneously satisfies the second condition with an amplitude corresponding to the stored energy. The amplitude remains constant because any losses are being compensated. The third above mentioned condition relating to a synchronism between the phases is satisfied because no phase shifts can occur in the oscillating circuit. Preferably, the electronic circuit for compensating losses has a negative resistance. This feature again results in a dedamping of the oscillating circuit, which dedamping can be achieved in an especially simple way.

BRIEF DESCRIPTION OF THE DRAWINGS

In order that the invention may be clearly understood, it will now be described in connection with example embodiments thereof, with reference to the accompanying drawings, wherein.

DETAILED DESCRIPTION OF A PREFERRED EXAMPLE EMBODIMENT AND OF THE BEST MODE OF THE INVENTION

Figure 1:
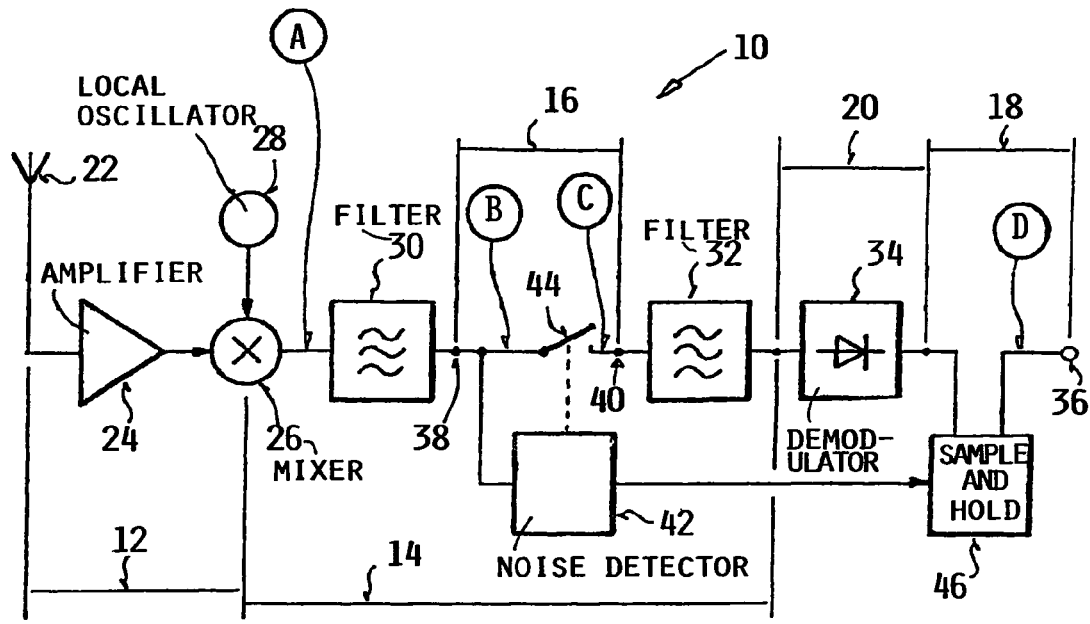
FIG. 1 illustrates a block circuit diagram of a signal processing circuit system with a conventional noise suppression downstream of a demodulator.
Figure 1A:
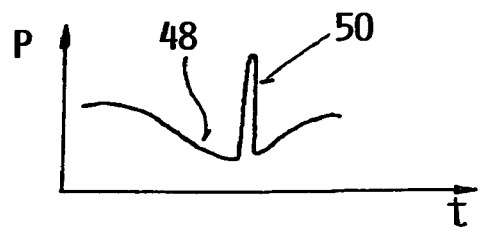
FIG. 1A to 1D illustrate signal characteristics at circuit points A, B, C and D in the conventional circuit of FIG. 1.

FIG. 1 shows a conventional signal processing system 10 including a high frequency section 12, an intermediate frequency section 14, a gating section 16, a demodulator 20 followed by a signal smoothing section 18 arranged in that sequence and relative to a signal flow from an antenna 22 forming a system input to an output terminal 36 of the signal smoothing section 18. Such a circuit system is known from the above mentioned German Patent Publication DE 39 04 505 C2. The known circuit further includes an input or high frequency circuit section 12 including an amplifier 24 connected with its input to the antenna 22 to receive amplitude modulated high frequency signals or radio frequency signals that are fed into the system 10. The amplifier 24 is a low noise amplifier, the output of which is supplied to a signal mixer 26 which also receives a frequency signal of a local oscillator or heterodyning oscillator 28 to form an intermediate frequency signal at its output A that is connected to a filter 30. Starting with the output signal A of the mixer 26, the filter 30, a decoupler 44 controlled by noise detector 42 and a further filter 32 form an intermediate frequency circuit section 14. The intermediate frequency filter 30 is, for example a band pass filter having a bandwidth of 200 kHz for example. The signal A is shown in FIG. 1A. The second filter 32 is a so-called channel filter having, for example a bandwidth of 3.4 kHz. The channel filter 32 serves for the selection of different transmission channels. The output signal of the channel filter 32 is supplied to a demodulator 34 forming the demodulation section 20, the output of which is supplied to the smoothing circuit section 18 including a sample-and-hold circuit 46, the output of which is supplied to the output terminal 36. The output 36 may, for example, be connected through a further amplifier with a loudspeaker.

Figure 1B:
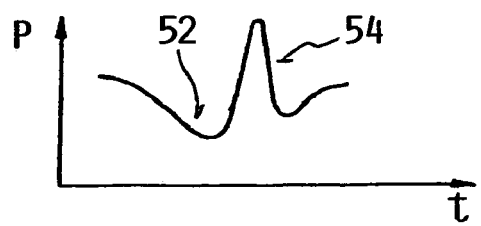
Figure 1C:
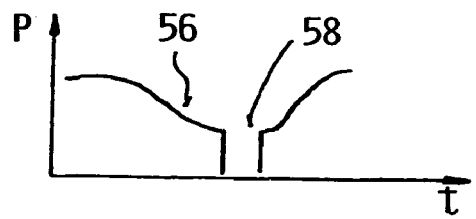
Figure 1D:
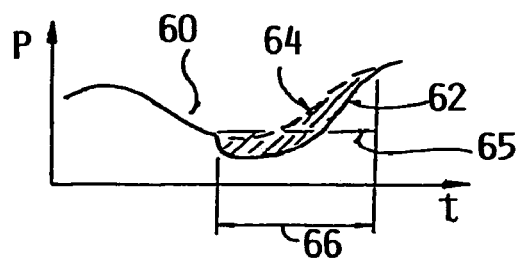

As shown in FIG. 1 the decoupler 44 forms a gating circuit section 16 having an input B at circuit point 38 and an output C, the signals of which are shown in FIGS. 1B and 1C respectively. The signals appear at the circuit points 38 and 40 respectively. Thus, the gating section 16 is arranged upstream of the demodulator 34 while the signal smoothing section 18 is conventionally arranged downstream of the demodulator. The signal D appearing at the output terminal 36 is shown in FIG. 1D. The gating section 16 further comprises a noise detector 42 and the decoupler 44, whereby the circuit portion upstream of the circuit point 38 can be decoupled from the circuit portion downstream of the circuit point 40. Such decoupling is controlled by operating the decoupler 44 such as an electronic switch 44 by the noise detector 42 when noise impulses occur.

The noise detector 42 monitors the signal B at the circuit point 38. This signal is supplied to the input of the noise detector 42 and has an intermediate frequency. When the input signal to the noise detector 42 has a curve that is characteristic for a noise impulse, the noise detector 42 is triggered and operates the decoupler 44, whereby feeding of the signal at the circuit point 38 to the circuit point 40 is interrupted. In order to minimize the effect of the interruption on the signal that is eventually supplied to the output terminal 36, the conventional circuit of FIG. 1 has a sample-and-hold circuit 46, which is also controlled by an output of the noise detector 42. The effect of the operation of the decoupler 44 in the gating section 16 and the operation at the sample-and-hold circuit 46 in the signal smoothing circuit 18 will be described in more detail below with reference to FIGS. 1A to 1D.

Figure 2:
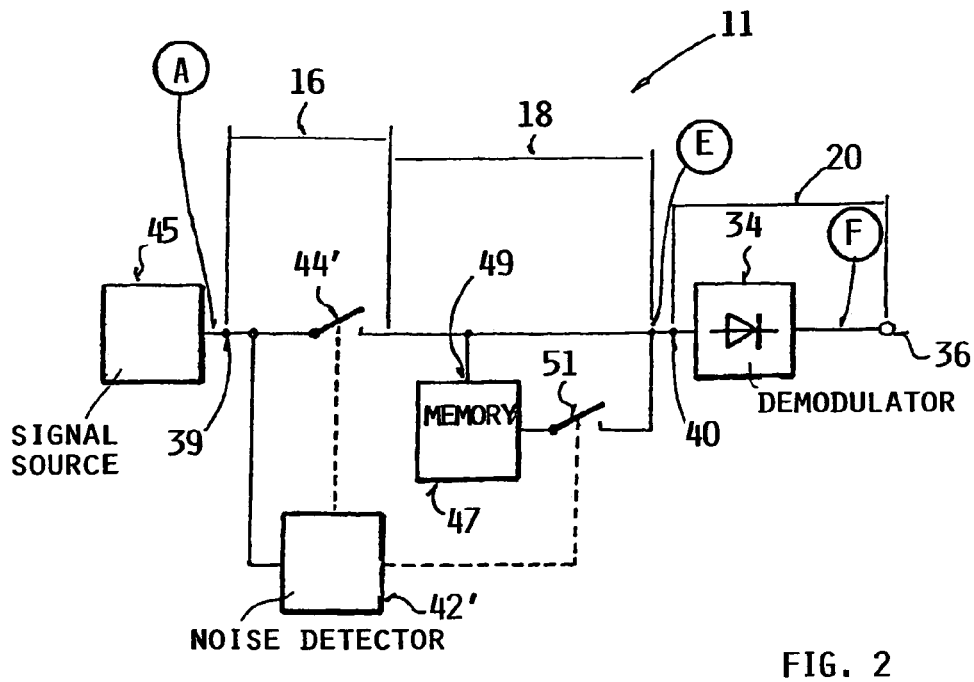
FIG. 2 illustrates a block circuit diagram of a signal processing circuit system according to the invention with a signal smoothing section connected in the circuit upstream of a demodulator.

FIG. 2 illustrates an example embodiment according to the invention showing a signal processing circuit System 11 including a signal source 45 providing at its output 39 a signal A that includes a noise signal component. The signal A is fed to a decoupler 44' controlled by a noise detector 42' forming with the decoupler 44' the gating section 16. According to the invention the signal smoothing section 18 is directly connected to the gating section 16 upstream of the demodulator 34. The signal smoothing section 18 comprises a signal smoothing circuit 47 including a memory 49 and a switch 51 also controlled by the noise detector 42 which monitors the input signal for the presence of noise impulses. When such noise impulses occur, the detector 42' opens the decoupler 44', thereby interrupting the feeding of the signals from the source 45 to the demodulator. Simultaneously the signal detector 42' provides a control signal for the switch 51, whereby the latter is closed. When the switch 51 is closed the signal smoothing circuit 47 supplies a smooth signal E to the input 40 of the demodulator 34. The demodulator 34 may, for example be a peak value rectifier circuit. The signal smoothing circuit 47 is connected with its input to the circuit connection between the decoupler 44' and the input 40 of the demodulator 34 and with its output to the switch 51. The signal smoothing circuit 47 is preferably realized as an electronic memory circuit which receives the signals from the signal source 45 as long as the decoupler 44' is closed. The signal smoothing circuit 47 is capable of storing in its memory 49 the signals from the source 45 as long as the decoupler 44' is closed. Thus, when the decoupler 44' opens, the memory in the signal smoothing circuit 47 will have stored therein the signal status just prior to the opening of the decoupler 44'. The smoothing circuit 47 then provides the signal E representing a preceding undisturbed signal state to the input 40 of the demodulator 34. Thus, the signal smoothing circuit 47 takes into account in its outputted smoothed signal the history of the signal from the signal source 45 prior to the occurrence of a noise or disturbance.

It is a substantial feature of the invention that the signal smoothing is performed upstream of the demodulator 34 when a noise occurs in the signal. FIG. 2 discloses such a circuit arrangement 11. FIG. 2 also symbolizes the present method steps in their sequence as performed by the individual circuit sections, namely the gating section 16, the smoothing section 18 and the demodulating section 20 arranged in that sequence relative to the flow of the signal from the output 39 of the signal source 45 to the output 36 of the demodulator 34. Thus, the individual circuit blocks in FIG. 2 are also viewed as representing the sequence of individual method steps. The individual blocks may particularly be viewed as sequentially occurring digital signal processing steps in a digital signal processing operation. The signal smoothing circuit 47 may, be realized in an analog or in a digital fashion. In any embodiment the signal smoothing circuit 47 will be so constructed that it will realize or satisfy the above mentioned three conditions.

Referring to FIGS. 1A, 1B, 1C and 1D in conjunction, these features illustrate the curves or signal characteristics of the signals A, B, C and D in the known signal processing system 10 shown in FIG. 1.

Figure 2A:
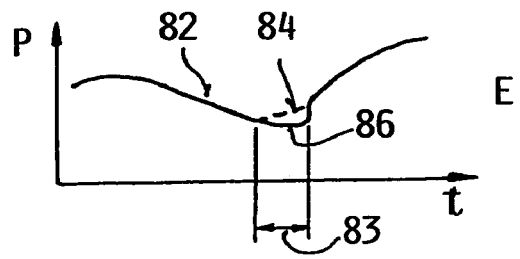
FIGS. 2A and 2B illustrate signal characteristics at points E) and F) in the circuit arrangement of FIG. 2.
Figure 2B:
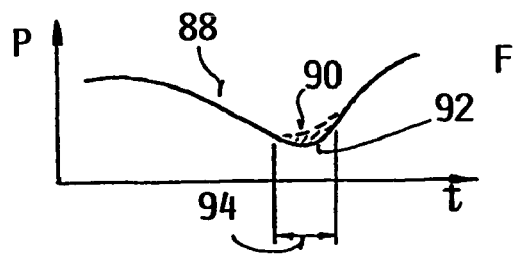
Figure 3:
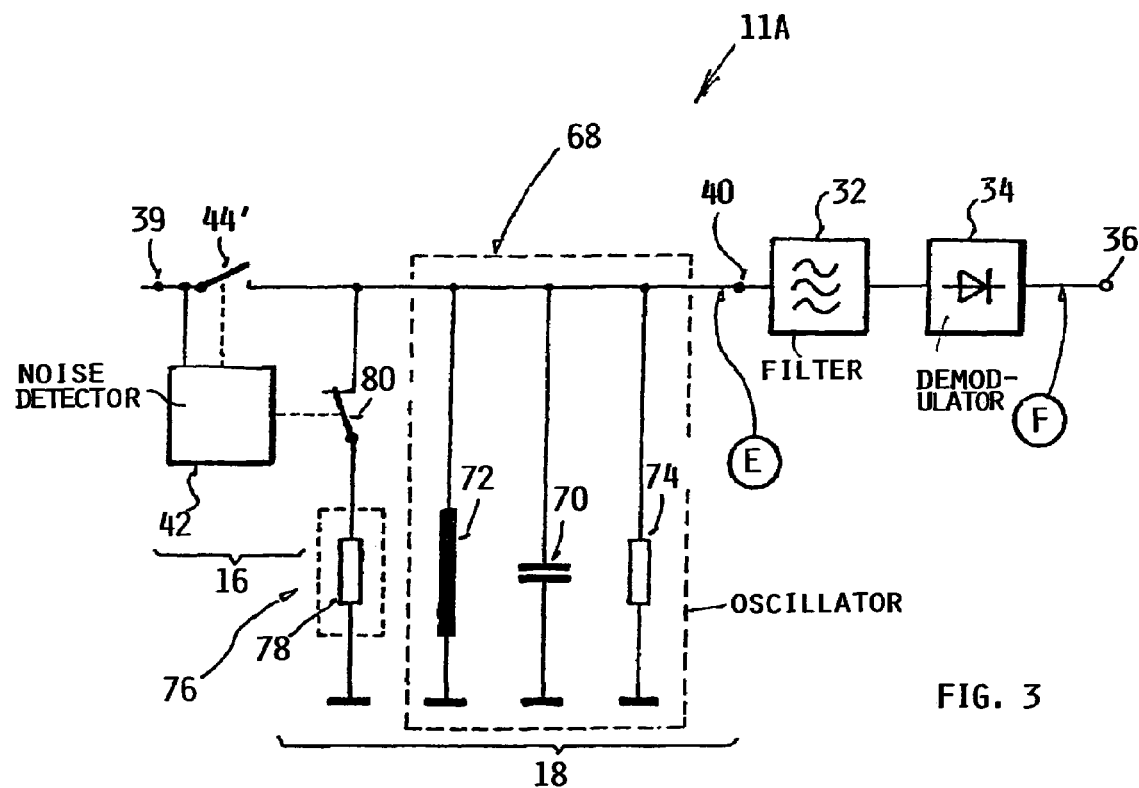
FIG. 3 illustrates a further circuit embodiment according to the invention, again with the signal smoothing features upstream of a filter and demodulator, whereby the signal characteristics at points E) and F) in FIG. 3 are also illustrated in FIGS. 2A and 2B, respectively.

FIGS. 2A and 2B illustrate the curves or signal characteristics that may be picked up at points E and F in the embodiments of the invention in FIGS. 2 and 3. All FIGS. 1A to 1D and 2A, 2B show the signal power as a function of time.

FIG. 1A shows with the curve 48 the power of the signal in the intermediate frequency section 14 downstream of the mixer 26 when a noise impulse 50 occurs. Initially, the noise impulse 50 still has a relatively small pulse width or time duration which corresponds, for example to ignition impulses of an internal combustion engine which generally are smaller than 20 microseconds in their duration.

FIG. 1B shows in the curve 52 that a signal has passed the intermediate frequency filter 30. Due to the limited bandwidth of the intermediate frequency filter 30 of, for example 200 kHz, and due to the time bandwidth law, the initially narrow noise impulse 50 of FIG. 1A has widened to a noticeably longer time duration as shown at 54 in FIG. 1B. The time bandwidth law states that a signal time duration t and the frequency requirement of that signal are reciprocal to one another.

FIG. 3C shows with the curve 56 the signal at point C in FIG. 1 downstream of the decoupler 44. A gating gap 58 has occurred in the transmitted signal due to the opening of the decoupler 44. This gating gap 58 is itself still a relatively narrow disturbance of the transmitted signal. Due to the above mentioned time/bandwidth law and due to the narrow bandwidth of the following channel filter 32 of, for example 3.4 kHz, the gap width 58 widens substantially as shown by the duration 66 in FIG. 1D, which shows curve 60 at the signal point D in FIG. 1 downstream of the sample-and-hold circuit 46. The curve portion 62 illustrates the signal characteristic without any countermeasures. The gating gap 58 has become fuzzy while passing through the channel filter 32 that has a narrow bandwidth and while passing through the demodulator 34. The dashed line curve portion 64 in FIG. 1D illustrates the characteristic of an undisturbed signal, namely without the noise impulse 50 and thus without the occurrence of a gating gap 58.

The hatched portion between the curves 62 and 64 illustrates the falsification of the useful signal that occurs due to the gating of the noise impulse 50. The straight line 65 in FIG. 1D corresponds to the frozen end value of the curve 60 at the point of time when the decoupler 44' opens in FIG. 1. This constant curve portion results in the signal processing circuit system 10 of FIG. 1 due to the fact that the noise detector 42 opens the decoupler 44' simultaneously with triggering the sample-and-hold circuit 46 which at this point freezes or stores the value of the useful signal prior to the occurrence of a noise signal for an expected duration. The expected duration is shown at 66 in FIG. 1D. This duration 66 is long enough so that the signal 60, at the end of the time duration 66, may again have substantially changed its characteristic, whereby a discontinuity in the signal characteristic occurs at the output 36 of the circuit 10 according to FIG. 1.

FIG. 3 shows a second embodiment of a signal processing circuit 11A according to the invention that achieves a substantial improvement in the signal transmission. More specifically, the size and duration of the disturbance of the useful signal by a noise impulse has been reduced substantially. The difference between the circuit 11A according to the invention and the circuit 10 according to FIG. 1 is seen in that the signal smoothing is performed prior to the demodulation. In this instance the signal processing or rather smoothing involves a replacement of the gated signal or rather of the signal portion that has been gated out. The signal processing in the circuit 11A is based on the interaction of an oscillating circuit 68 with the signal processing stages shown in FIG. 3. The oscillating circuit 68 preferably connected between the input 39 and the circuit point or knot 40 where the signal E can be picked-up. This point 40 is positioned downstream of the decoupler 44'. Thus, the gating and smoothing of noise signals takes place where these noise signals or impulses still have a large amplitude, but still have a narrow time duration.

The oscillating circuit 68 in FIG. 1 may, for example comprise a parallel circuit of a capacitor 70 and an inductance 72 and a damping resistor 74. An electronic circuit 76 connectable in parallel to the oscillator 68 may be used for dedamping the circuit 68 when it is decoupled by the decoupler 44' from the input 39. Preferably, the electronic circuit 76 comprises a negative resistor 78. A negative resistor in this sense may be incorporated by any circuit which produces an increasing current as a function of a dropping voltage.

The negative resistor 78 for dedamping the oscillator 68 is preferably connected to the oscillator 68 through a switch 80 which is closed by the noise detector 42 when the circuit components 32, 34, 36 are decoupled from the input 39 by the decoupler 44'. Thus, the switch 80 is preferably operated by the noise detector 42 in an opposing synchronism with the control of the decoupler 44'. More specifically, the switch 80 is opened when the decoupler 44' is closed and vice versa.

The oscillating circuit 68 of FIG. 3 should have a suitable bandwidth. If the bandwidth is too narrow, the effects of noise impulses would be unnecessarily prolonged as shown above with reference to FIGS. 1C and 1D relating to the signal processing circuit 10 according to the prior art shown in FIG. 1. If the oscillating circuit 68 has a bandwidth that is too large it could substantially influence neighboring channels so that the above mentioned first condition is not satisfied. According to the first condition, the oscillation of the oscillator circuit 68 shall have the same amplitude as the intermediate frequency directly prior to the occurrence of a noise impulse 50.

In FIG. 3, when a noise impulse occurs in the intermediate frequency section 14 the noise detector 42 reacts and decouples the oscillator circuit 68 from the input signal at the input terminal 39. This input signal may be any amplitude modulated signal. Thus, a high frequency section 12 and a mixing section 26, as well as an intermediate frequency filter 30 may be connected to the input terminal 39 of FIG. 3. Similarly, a signal source 45 as used in FIG. 2 may be connected to the terminal 39. In the following text it is assumed that an antenna 22, an amplifier 24, a signal mixing circuit 26, a local oscillator 28, and an intermediate frequency filter 30 are connected in that order to the terminal 39.

As mentioned above in FIG. 3, the noise detector 42 simultaneously opens the decoupler 44' while closing the switch 80, thereby connecting the oscillating circuit 68 with the circuit 76 which includes the negative resistance 78. As a result, the oscillating circuit 68 is no longer triggered by the intermediate frequency signal. Rather, the oscillating circuit 68 is dedamped. As a result, the following circuit stages, particularly the channel filter 32 and the demodulator 34 remain coupled with the oscillating circuit 68. The dedamping of the circuit 68 by the electronic circuit 76 is performed in such a way that the damping losses of the oscillating circuit 68 caused by the oscillating circuit resistor 74 are compensated. With such a compensation neither the following channel filter 32 nor the demodulator 34 notice a signal interruption which is rather desired.

The just mentioned desirable result is based on the fact that the actual useful information in a signal processing system for transmitting an amplitude modulated signal, is present in the amplitude of the useful signal. Thus, the energy stored in the oscillating circuit 68 is proportional to the square of the signal voltage at the oscillating circuit 68. When the oscillating circuit 68 is decoupled from its signal source as described above or from the signal source 45 shown in FIG. 2, and if simultaneously the losses are compensated by the activation of the negative resistor 78, the oscillating circuit 68 will continue to oscillate at its resonance frequency which corresponds to the energy stored in the oscillating circuit. This oscillation at the circuit's resonance frequency satisfies the above mentioned second condition. By compensating the losses, the amplitude remains constant so that the above mentioned first condition is also satisfied. The third condition is satisfied due to the fact that no phase shifts or phase jumps occur at the oscillating circuit 68.

FIG. 2A illustrates the signal characteristics at the points E and F in present FIGS. 2 and 3. The signal or signal E at the point 40 in the embodiment of FIG. 3 of the present invention is shown as a curve 82. The time duration 83 in FIG. 2A represents the gating gap caused by the opening of the decoupler 44' in FIGS. 2 and 3 while the switch 51 in FIG. 2 or the switch 80 in FIG. 3 are simultaneously closed. The curve portion 84 shows the characteristic of the signal 82 as it would appear theoretically without the occurrence of a noise impulse 50. The curve portion 86 shows the curve characteristic of the actual signal at the point E in FIGS. 2 and 3 as is achieved by the signal processing upstream of the demodulator 34 in FIG. 2 and upstream of the filter 32 in FIG. 3.

The FIG. 2A also clarifies in graphic form how the signal smoothing circuit 47 in FIG. 2 or the oscillating circuit 68 in FIG. 3 produces a replacement signal 86 during the gating gap, that is during the time duration 83 shown in FIG. 2A. The replacement signal 86 deviates only for a very short time duration and hardly at all from the theoretical signal characteristic 84. Due to the fact that the deviation of the replacement signal 86 from the theoretical characteristic 84 without a noise disturbance is so small, no large signal disturbance occurs in the following channel filter 32 and in the demodulator 34. FIG. 2B shows this fact where the curve 88 represents the signal characteristic at the point F downstream of the demodulator 34 in FIGS. 2 and 3. The duration of the disturbance is shown at 92 in FIG. 2B. This duration 94 is substantially smaller than the time duration 66 in FIG. 1D relating to the conventional circuit 10 of FIG. 1. This reduction of the time duration 94 relative to the time duration 66 is the main advantage of the invention because such reduction of the time duration of a disturbance or noise has a beneficial influence on the noticeability or rather audibility of the disturbance or noise. The shorter the time duration of the disturbance, the less likely is the probability that the disturbance will be heard. Similarly, the size of the disturbance is substantially reduced. Please compare the hatched area of FIG. 1D with the hatched area of FIG. 2B.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method for suppressing noise impulses in a system for processing amplitude modulated signals, said method comprising the following steps:
   a) receiving an amplitude modulated input signal (48) including noise impulses;
   b) gating said amplitude modulated input signal for separating said noise impulses from said amplitude modulated input signal to produce an amplitude modulated gated signal,
   c) producing a replacement signal dedamped to have the same amplitude as said amplitude modulated input signal had prior to an imposition of said noise impulses on said amplitude modulated input signal,
   d) smoothing said amplitude modulated gated signal by inserting said replacement signal into said amplitude modulated gated signal to produce a smoothed signal, and
   e) demodulating said smoothed signal after said smoothing step.

2. The method of claim 1, further comprising feeding said amplitude modulated input signal (48) through a high frequency stage (12).

3. The method of claim 2, further comprising mixing said amplitude modulated input signal in said high frequency stage with a local oscillator frequency to produce an intermediate frequency signal and then performing said gating step on said intermediate frequency signal.

4. The method of claim 1, further comprising performing said gating step prior to mixing said gated signal with a local oscillator frequency to produce an intermediate frequency signal which is then smoothed.

5. The method of claim 1, further comprising performing said producing step so that said replacement signal has a frequency corresponding to a frequency of said amplitude modulated input signal (48).

6. The method of claim 1, further comprising performing said producing step so that said replacement signal has a phase position at edges of a gating gap which phase position is the same as a phase position of said amplitude modulated gated signal.

7. The method of claim 1, further comprising shifting said amplitude modulated input signal (48) prior to said gating step, into such a frequency bandwidth that a noise impulse has a pulse width within the range of 5 to 25 microseconds.

8. The method of claim 1, further comprising performing said step (c) of producing said replacement signal by the following sub-steps (ca) supplying said amplitude modulated gated signal to an input of an oscillating circuit (68), (cb) decoupling (44') said oscillating circuit (68) from said amplittde modulated gated signal, and (cc) dedamping said oscillating circuit (68) to provide said replacement signal.

9. The method of claim 8, wherein said oscillating circuit (68) is oscillating at its own resonance frequency.

10. A method for suppressing noise impulses in a system for processing amplitude modulated signals, said method comprising the following steps:
   a) receiving an amplitude modulated input signal (48) including noise impulses;
   b) gating said amplitude modulated input signal for separating said noise impulses from said amplitude modulated input signal to produce an amplitude modulated gated signal,
   c) producing a replacement signal so that said replacement signal has a phase position at edges of a gating gap which phase position is the same as a phase position of said amplitude modulated gated signal,
   d) smoothing said amplitude modulated gated signal by inserting said replacement signal into said amplitude modulated gated signal, to produce a smoothed signal, and
   e) demodulating said smoothed signal after said smoothing step.

11. A method for suppressing noise impulses in a system for processing amplitude modulated signals, said method comprising the following steps:
   a) receiving an amplitude modulated input signal (48) including noise impulses;
   b) shifting said amplitude modulated input signal, prior to a gating step, into such a frequency band width that a noise impulse has a pulse width within the range of 5 to 25 microseconds,
   c) gating said amplitude modulated input signal for separating said noise impulses from said input signal to produce an amplitude modulated gated signal,
   d) smoothing said amplitude modulated gated signal to produce a smoothed signal, and
   e) demodulating said smoothed signal after said smoothing step.

12. A signal processing system for suppressing noise in an amplitude modulated input signal received by a signal processing circuit, said system comprising: a signal gating circuit (16), a signal smoothing section (18) and a signal demodulating circuit (20) arranged in that order as viewed in a signal flow direction from an input to an output so that signal smoothing takes place prior to signal demodulating, wherein said gating circuit (16) comprises a decoupler (44') and a noise detector (42) for controlling said decoupler (44'), said system further comprising an oscillating circuit (68), said decoupler (44') being operatively connected to an input of said oscillating circuit (68) for decoupling said oscillating circuit (68) from a system input (39) in response to a received noise impulse (50).

13. The system of claim 12, wherein said signal smoothing circuit (18) is a circuit for producing a replacement signal for insertion into an amplitude modulated gated signal downstream of said signal gating circuit (16).

14. The system of claim 12, further comprising a high frequency circuit positioned upstream of said signal gating circuit <16>.

15. The system of claim 12, further comprising a high frequency circuit and an intermediate frequency generating circuit positioned upstream of said signal gating circuit.

16. The system of claim 12, wherein said signal smoothing circuit (18) comprises an oscillating circuit (68).

17. The system of claim 16, wherein said oscillating circuit (68) oscillates within a frequency bandwidth which is smaller than a frequency channel bandwidth of a signal sequence of said amplitude modulated input signal.

18. The system of claim 12, wherein said oscillating circuit (68) comprises at least an inductance (72) and a capacitor (70) connected in parallel to said inductance (72).

19. The system of claim 12, further comprising an electronic dedamping circuit (76) operatively connected to said oscillating circuit (68) for dedamping said oscillating circuit when said oscillating circuit is decoupled form said system input (39).

20. The system of claim 19, wherein said electronic a dedamping circuit (76) is so dimensioned that damping losses of said oscillating circuit (68) are compensated when said oscillating circuit (68) is decoupled from said system input (39).

21. The system of claim 19, wherein said electronic dedamping circuit (76) comprises a negative resistor (78).

22. The system of claim 21, further comprising a switch (80) connecting said negative resistor (78) in parallel to said oscillating circuit (68) when said oscillating circuit is disconnected from said system input and vice versa.

23. The system of claim 22, wherein said decoupler (44') and said switch (80) are both operatively connected to said noise detector (42).

24. A signal processing system for suppressing noise in an amplitude modulated signal received by a signal processing circuit, said system comprising: a signal gating circuit (16), a signal smoothing section (18) and a signal demodulating circuit (20) arranged in that order as viewed in a signal flow direction from an input to an output so that signal smoothing takes place prior to signal demodulating, said system further comprising a noise detector (42'). a decoupler (44') and a switch (51), wherein said decoupler (44') and said switch (51) are both controlled by said noise detector (42'), and wherein said signal smoothing section (18) comprises a smoothing circuit (47) including a memory (49).

* * * * *

UNITED STATES PATENT AND TRADEMARK OFFICE
CERTIFICATE OF CORRECTION

PATENT NO. : 7,286,809 B2  
APPLICATION NO. : 10/938073  
DATED : October 23, 2007  
INVENTOR(S) : Friesen et al.

It is certified that error appears in the above-identified patent and that said Letters Patent is hereby corrected as shown below:

Title page,  
Item (*) Notice,  
Line 3, after "by", replace "432" by --396--;  
Following item (65) insert  
--(30)     Foreign Application Priority Data  
Sep. 12, 2003   (DE)   ..................... 103 43 332--;

Column 6,  
Line 36, after "circuit", replace "System" by --system--;

Column 8,  
Line 29, after "68", insert --is--;

Column 11,  
Line 7, after "sub-steps", insert a paragraph break;  
Line 10, before "modulated", replace "amplittde" by --amplitude--;  
          after "and", insert a paragraph break;

Column 12,  
Line 12, after "circuit", replace "<16>" by --(16)--;  
Line 30, after "electronic", delete "a";  
Line 51, after "(42')", replace "." by --,--.

Signed and Sealed this

Twenty-fifth Day of August, 2009

David J. Kappos  
*Director of the United States Patent and Trademark Office*